(12) United States Patent
Madsen

(10) Patent No.: US 10,107,657 B2
(45) Date of Patent: Oct. 23, 2018

(54) MONITORING SYSTEM

(71) Applicant: REMONI APS, Østbirk (DK)

(72) Inventor: Bo Eskerod Madsen, Østbirk (DK)

(73) Assignee: REMONI APS, Østbirk (DK)

(*) Notice: Subject to any disclaimer, the term of this patent is extended or adjusted under 35 U.S.C. 154(b) by 314 days.

(21) Appl. No.: 14/874,781

(22) Filed: Oct. 5, 2015

(65) Prior Publication Data
US 2016/0025536 A1 Jan. 28, 2016

Related U.S. Application Data

(63) Continuation of application No. PCT/DK2014/000019, filed on Apr. 23, 2014.

(30) Foreign Application Priority Data

Apr. 26, 2013 (DK) .................................. 2013 00249

(51) Int. Cl.
G01F 1/56 (2006.01)
G01D 4/02 (2006.01)
(Continued)

(52) U.S. Cl.
CPC .................. G01F 1/56 (2013.01); G01D 4/02 (2013.01); G06F 17/18 (2013.01);
(Continued)

(58) Field of Classification Search
CPC combination set(s) only.
See application file for complete search history.

(56) References Cited

U.S. PATENT DOCUMENTS

| 7,952,239 | B2 | 5/2011 | Clark et al. |
| 9,767,415 | B2* | 9/2017 | Ito .......................... G06N 7/005 |
| 2005/0065743 | A1 | 3/2005 | Cumming et al. |

(Continued)

FOREIGN PATENT DOCUMENTS

| EP | 2348596 A1 | 7/2011 |
| EP | 2489987 A2 | 8/2012 |

(Continued)

OTHER PUBLICATIONS

International Search Report for PCT Patent App. No. PCT/DK2014/000019 (dated Aug. 11, 2014).

(Continued)

Primary Examiner — Mamadou Diallo
(74) Attorney, Agent, or Firm — Cermak Nakajima & McGowan LLP; Adam J. Cermak

(57) ABSTRACT

A system (2) for monitoring resource flows at a number of devices (D1, D2, D3) includes a receiving unit (4) which receives data from a number of sensors (S1, S2, S3, S4, S5) configured to detect the flow rate and/or the change in the flow rate at device level, and a number of meters (M1, M2, M3) configured to measure the flow for at least a part of the devices (D1, D2, D3). The system (2) has a calculation module (8) configured to receive information from the sensors (S1, S2, S3, S4, S5) and the meters (M1, M2, M3), and the calculation module (8) includes a mathematical statistical model (38) configured to estimate and/or predict flow of resource and/or performance (e.g., activity) of at least a selection of the devices (D1, D2, D3).

16 Claims, 5 Drawing Sheets

(51) Int. Cl.
*G06F 17/18* (2006.01)
*G06F 17/50* (2006.01)

(52) U.S. Cl.
CPC ........ *G06F 17/5009* (2013.01); *Y02B 90/245* (2013.01); *Y04S 20/40* (2013.01)

(56) References Cited

U.S. PATENT DOCUMENTS

| | | | |
|---|---|---|---|
| 2006/0193262 | A1 | 8/2006 | McSheffrey et al. |
| 2008/0224892 | A1 | 9/2008 | Bogolea et al. |
| 2010/0167659 | A1 | 7/2010 | Wagner |
| 2010/0217550 | A1 | 8/2010 | Crabtree et al. |
| 2011/0037455 | A1 | 2/2011 | Oren et al. |
| 2011/0144819 | A1* | 6/2011 | Andrews ............... G01D 4/004 700/291 |
| 2012/0004784 | A1 | 1/2012 | Oh et al. |
| 2012/0072141 | A1* | 3/2012 | Hidai ................ G01R 19/2516 702/60 |
| 2012/0290230 | A1* | 11/2012 | Berges Gonzalez ... G01D 4/004 702/61 |
| 2013/0158908 | A1* | 6/2013 | Ramakrishnan ....... G01D 4/002 702/60 |
| 2013/0231795 | A1* | 9/2013 | G .......................... G01D 4/002 700/295 |
| 2014/0172758 | A1* | 6/2014 | Klinnert ............. G08B 21/0423 706/12 |
| 2014/0207398 | A1* | 7/2014 | Lai ........................... G01D 4/00 702/61 |
| 2015/0046135 | A1* | 2/2015 | Ito ........................... G06F 17/10 703/2 |
| 2015/0137792 | A1* | 5/2015 | Filippi .................... G01D 4/00 324/76.11 |
| 2015/0276830 | A1* | 10/2015 | Airaksinen ............ G01D 4/002 324/74 |
| 2017/0199800 | A1* | 7/2017 | Johns .................. G06F 11/3409 |

FOREIGN PATENT DOCUMENTS

| | | |
|---|---|---|
| GB | 2494514 A | 3/2013 |
| JP | 2005-062171 A | 3/2005 |
| WO | WO00/37933 A1 | 6/2000 |
| WO | WO01/39284 A1 | 5/2001 |
| WO | WO2012/099588 A1 | 7/2012 |

OTHER PUBLICATIONS

Office Action from Singapore Patent App. No. 11201508799V (dated Aug. 10, 2016).

* cited by examiner

MONITORING SYSTEM

This application is a Continuation of, and claims priority under 35 U.S.C. § 120 to, International Application No. PCT/DK2014/000019, filed 23 Apr. 2014, which claims priority therethrough under 35 U.S.C. §§ 119, 365 to Danish App. No. PA 2013 00249, filed 26 Apr. 2013, the entireties of which are incorporated by reference herein.

BACKGROUND

Field of Endeavor

The present invention generally relates to a system and a method for non-intrusive monitoring. The present invention more particularly relates to a system and a method for non-intrusive monitoring at device level to overview technical installations to identify devices that cause loss of resources.

Brief Description of the Related Art

Waste and overconsumption of resources are a major concern in modern society, because it leads to both environmental and economic problems. A significant part of the wasted resources origins from dysfunctional or inefficient devices. Dysfunctional devices may lead to waste of resources because the intended production is damaged or even lost, whereas inefficient devices may lead to overconsumption of resources to obtain the desired production.

From industrial production it is well known that present and emerging problems can be identified, and overconsumption of resources reduced, by continuous monitoring at level of the single production devices. The challenge of the present systems is, however, that the expenses to install and operate the entire set of needed specialized technologies limit the areas of use. Moreover, such monitoring systems are often complicated to retrofit at existing device installations, and difficult to fit acceptable into the designs.

The so-called non-intrusive monitoring (NILM) systems that apply a technique that, e.g., determines the electrical load composition of a household through a single point of measurement at the main power feed are well known. The technique is described by G. W. Hart in the paper "Residential energy monitoring and computerized surveillance via utility power flows" in Technology and Society Magazine, vol. 8, no. 2, pp. 12, 16, June 1989.

This technique, however, is unable to handle a complex electrical setup, and to overcome the challenge it has been proposed to add simple sub-metering electricity sensors in the installation, to distinguish devices with similar energy flow. EP2489987A2 discloses a system for non-invasive energy flow monitoring. The system includes one or more device embodiments that include a transformer configured to couple the device to a circuit conductor that is coupled to an additional device. The system moreover has a detection module configured to detect a change in a power signal over the circuit conductor, and a transmission module configured to transmit a unique signal associated with the additional device over the circuit conductor, if the change in the power signal meets or exceeds a particular threshold.

Even such more advanced NILM approaches are, however, often unable to forecast and estimate emerging problems and/or overconsumption of resources. In dynamic systems, such as ventilation, hygienisering or food production, it is typically insufficient to know, e.g., the flow of electricity, to be able to model the actual performance of the system.

When multiple sources of variation affects the latent (e.g. underlying) dynamic (e.g., evolving) stochastic process it is virtually impossible to model the stochastic process efficiently by the methods of the prior art. The only alternative is therefore, the expensive and complicated monitoring technologies known, e.g., from industry.

To be more specific, there is need for a system that can be retrofitted at an existing installations (in a building by way of example), to give an overview of the performance of critical devices. There is also need for the system to estimate and predict the activity, energy consumption and/or resource flow (for instance heat, power and/or ventilation) of the critical devices.

Accordingly, one aspect of the present invention includes a system for monitoring resource flow(s) at a number of devices, which system is less expensive and complicated than the prior systems that apply traditional monitoring technologies.

Another aspect the present invention includes a system that is capable of estimating and predicting the activity, energy consumption, and/or resource flow (e.g., heat, power and/or ventilation) of a number of predefined devices.

SUMMARY

Preferred embodiments are explained in the following description and illustrated in the accompanying drawings.

The system described herein is a system for monitoring resource flow(s) at a number of devices, which system includes a receiving unit configured to receive data from a number of sensors configured to detect the flow rate and/or the change in the flow rate at device level, and a number of meters configured to measure the overall flow for at least a part of the devices. The system includes a calculation module configured to receive information from the sensors and the meters and the calculation module includes a mathematical statistic model configured to estimate and/or predict the flow of resources and/or the performance of at least a selection of the devices.

Hereby it is achieved that the system can estimate and predict the activity, performance and or resource flow (for instance heat, power or ventilation air flow) of a group of devices, for example a HVAC (heating, ventilation, and air conditioning) system in a commercial building or in a production factory. Moreover, the system can detect if the devices are used and/or working in a manner that leads to overconsumption of resources.

Moreover, it is achieved that the system can be built by means of less complicated and accurate (and thus cheaper) monitoring devices (sensors) than the prior art systems. In fact, it is possible to apply sensors that are unfit for being used in the known systems. By applying a mathematical statistic model, a system as described herein makes it possible to "calibrate" and/or adjust the measurements from "simple" and "cheap" sensors (having low accuracy compared with a typical meters being used in such systems).

Devices may be electrical devices, heaters, pipes or other structures through which a flow (electricity, power, heat energy, air, gas, water, or electromagnetic radiation) may pass.

By device is meant a single device, a well-defined group of devices, or sub-devices of, e.g., complex devices such as a machinery.

By the term sensor is meant a unit capable of detecting one or more parameter such as temperature, light, or flow of water, current, gas, and/or air. The sensor may be configured to detect the flow rate and/or the change in the flow rate of a flow for instance. The detection may be a direct measurement or an estimate.

It is preferred that all the sensors can be retrofitted to an existing installation (a building or a machine by way of example).

It may be an advantage to use sensors that are configured to be attached to the outside of a cable or a pipe. Such sensors may be piezoelectric sensors. The sensors may be mechanically attached at the outside of pipes, tubes and cables of different geometry, dimension, material and medium.

The sensors are configured to send information to the receiving unit and the information may be any suitable type of signal (e.g., a wireless signal). The information may be any type of data detected by the sensors and meter(s).

The calculation module may be any suitable type of calculation module configured to receive information from the sensors and to include a mathematical statistic model.

By the term estimate and/or predict is meant a determination by using the mathematical statistic model. The determination may be a forecast based on information from the collected data from the sensors and meters as well as any suitable other information. In any case it may be an advantage to apply a mathematical statistic model that is developed to match the application. In other words, different applications may require different mathematical statistic models.

By the term resource flow is meant flow of heat, power, and/or flow of a fluid through a pipe (or another structure) and/or intensity of electromagnetic radiation or a flow of another quantity. The resource flow may be power uptake (energy per time unit) or a flow (e.g., water) through a pipe (volume per unit time) by way of example.

It is preferred that the calculation module includes a mathematical statistic model configured to estimate and/or predict resource flow of all the devices.

It is preferred that the calculation module includes a mathematical statistic model configured to estimate and/or predict that a device do not perform as expected.

It is preferred that the mathematical statistic model can generate warnings and alarms to inform the user if the system does not perform as expected.

It is preferred that the sensors are configured to communicate wirelessly with the receiving unit.

It is possible to use sensors of simple type, e.g., sensors that are configured to be attached to the outside of a pipe or a cable.

By the term meter is meant a unit configured to measure the overall resource flow of at least a section of the devices. A meter may be a unit configured to measure the overall resource flow of at least a section of the devices by a predefined accuracy, preferably a high accuracy. Such meter is typically used to perform precise measuring of energy consumption, heat, cooling, and electricity by way of example.

In a system as described herein it would be possible to use sensors having significantly lower accuracy than the meter(s) of the system. By using a mathematical statistic model, it is possible to "compensate" for the lower accuracy of the sensors.

Hereby an overall measure of at least a section of the devices can be provided.

It may be an advantage that the system includes a number of meters configured to measure resource flow of all the devices and to send information to the receiving unit. Hereby the total resource flow can be determined.

It may be an advantage that the meters are high precision meters capable of providing a very accurate measurement of the resource flow so that the detected data can be used to provide accurate estimates and/or predictions of resource flow at the devices.

It is possible to have a system, in which not all devices are equipped with a sensor and where the meters measure the resource flow of more devices than the devices equipped with a sensor.

The mathematical statistic model is preferable configured to estimate and/or predict resource flow of the devices on the basis of the information from the sensors and from the meters even if not all devices are equipped with a sensor.

It may be an advantage that the mathematical statistic model is of the specific class that is able to estimate the latent part of each main meter measurement that is associated with each sensor.

It may be beneficial that the mathematical statistic model comprises:
- a mathematical function component modelling the latent mapping from the main meter measurements onto the specific sensor measurements and
- a stochastic component modelling the measurement noise and the part of each main meter measurement associated with usage which are not measured by sensor(s), if any.

The mathematical statistic model may be of any suitable type capable of estimating the latent part of each main meter measurement that is associated with the sensors. As known from the field of statistical modelling, several approaches can be used to build a model of the specific class, e.g., time series analysis methods and/or multivariate data-analysis methods, such as Analysis of Variance (ANOVA), Markov models, Generalized Linear Models (GLM), and Multivariate Gaussian Models.

It may be beneficial that the system includes a user interface, preferably a remote user interface, and that the user interface provides access to generated information such as warnings, alarms, and estimated and/or predicted resource flow(s) of at least a selection of the devices.

Hereby a very simple and user friendly system can be provided.

It may be an advantage that the calculation module is implemented in one or more router. Hereby it is possible to provide a reliable and safe configuration of the system.

It may be beneficial that one or more of the sensors includes an energy harvester. Hereby the sensors may be self-sufficient with power so that no battery or external energy is required.

It may be an advantage that the harvested energy is used to detect resource flow or change resource flow rate of the devices. Hereby simple and efficient sensors may be provided and a valid and reliable detection technique may be applied.

It may be an advantage that the harvested energy is used to detect resource flow or change resource flow rate of the devices and to perform wireless communication with the receiving unit and/or calculation module.

It may be an advantage that the calculation module and the mathematical statistic model are integrated in an apparatus of the system. Hereby there is no need for a separate router and very simple system can be provided.

It may be an advantage the calculation module and the mathematical model and the user interface are integrated in an apparatus of the system.

It may be adventurously that the calculation module and the mathematical statistic model are integrated in a user interface. Such system is simple and requires only few features.

It may be an advantage that the user interface is a smartphone or similar smart device.

Moreover it may be an advantage that the calculation module and the mathematical statistic model are integrated in a smartphone.

In a preferred embodiment, the calculation module is a cloud service with mathematical statistic model and a data storage. The use of such cloud service makes it possible to connect other systems to the cloud service and hereby get additional data for the mathematical statistic model from other systems. Accordingly, a very complex and accurate mathematical statistic model can be developed. Moreover, trends may be detected faster when the cloud service gets additional data for the mathematical statistic model from other systems.

It may be an advantage that the system includes a control unit configured to change the activity of one or more of the devices or another apparatuses, e.g., a valve of a main pipe. Hereby it is achieved that the system can perform actions (switch off devices, regulation of speed of a motor, or other action) by using a control unit. The control unit may include one or more actuators (e.g., an electric valve or an electrically controlled permanent magnet motor by way of example).

It is preferred that the system is configured to estimate the actual and/or future activity of at least a selection of the devices. Hereby, the system can be used to regulate and optimize the activity of the devices in order to save energy and avoid dysfunctional devices from being kept turned on, and to avoid waste of resources and overconsumption of resources.

It may be an advantage that the sensors are configured to be attached as, e.g., tape, clip, or strips to the devices (e.g., on the power cable of an electrical device). In this way the sensors do not need to have physical contact to the interior of the monitored pipe, cable, container, cooling/heating device of the device.

The methods described herein include a method for monitoring resource flow(s) of a number of devices by using a receiving unit which receives data from a number of sensors configured to detect the flow rate and/or the change in the flow rate at device level, and a number of meters configured to measure the flow for at least a part of the devices. The method includes the step of estimating and/or predicting loss and/or flow of resource(s) of at least a selection of the devices by using a calculation module configured to receive information from the sensors and the meters, where the estimating and/or predicting resource flow is carried out in a calculation module that comprises a mathematical statistic model.

It may be an advantage that the method includes the step of sending information from a number of meters configured to measure the resource flow of at least a section of the devices to the receiving unit and applying the information from the meters to estimate and/or predict resource flow of at least a selection of the devices.

It is preferred that the method uses a system as described herein to estimate and/or predict resource flow of at least a selection of the devices.

It may be an advantage that the receiving unit is configured to automatically recognize one or more of the sensors and/or meters of the system. Hereby, it becomes easy for the user to install the sensors and/or meters of the system.

It may be an advantage that the user of the system can add further information about a sensor, meter, or control unit through a user interface. The added information can be used in the mathematical statistic model and/or in a user interface.

It may be an advantage that at least some of the sensors and/or meters contain a timestamp module to ensure correct linking of data from the sensors and/or meters.

The data from the sensors and/or meters may be sampled at any suitable sampling rate, e.g., once a second, once a minute or once every half hour.

It may be an advantage to use one or more repeaters each configured to receive a signal and retransmit it at a higher level or higher power, or onto the other side of an obstruction, so that the signal can cover longer distances.

It may be an advantage that the data from the sensor and/or meters are condensed throughout the data collection process, so only sufficient data to determine the latent process is transferred further on to the mathematical statistic model. It may be, e.g., by condensing a sequence of homologue status packages from a sensor to a single data package containing only the start and the end time of the actual status of the sensor. The data condensing may be performed, e.g., at one or more routers and/or sensors and/or meters.

It may be beneficial that the mathematical statistic model and/or a user interface and/or the control units are operated through a cloud service, which may be hosted on, e.g., a central server, a mobile processor, a laptop, an embedded controller, or one or more local routers.

The mathematical statistic model may be implemented in computer code, or directly in an integrated circuit.

It may be an advantage that a user interface has remote access to the system.

It may be an advantage that wireless data communication is carried out by using a ZigBee and/or WiFi data communication protocol.

BRIEF DESCRIPTION OF THE DRAWINGS

The invention will become more fully understood from the detailed description given herein below. The accompanying drawings are given by way of illustration only, and thus, they are not limitative of the present invention. In the accompanying drawings.

DETAILED DESCRIPTION OF EXEMPLARY EMBODIMENTS

Figure 1:
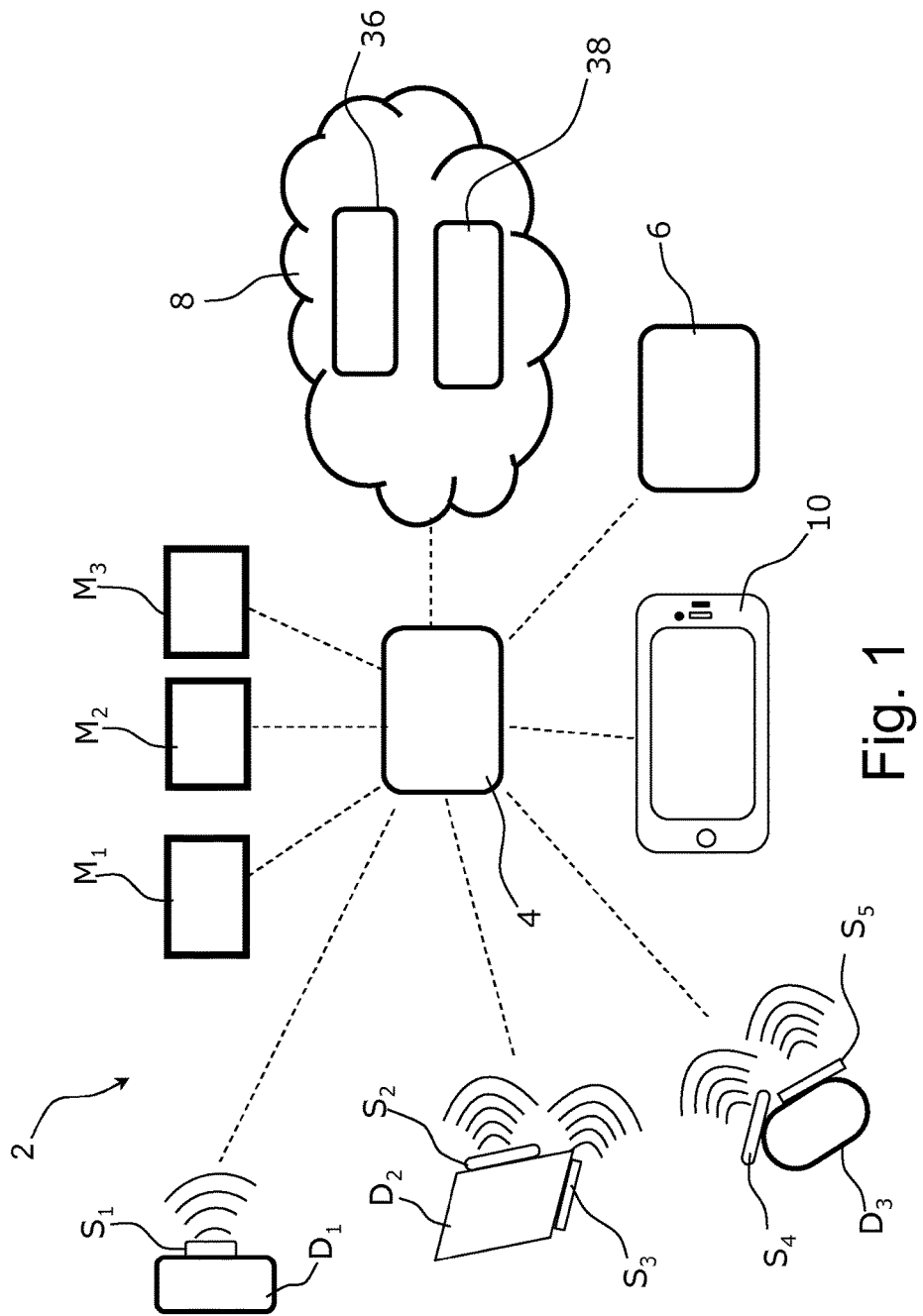
FIG. 1 shows a schematic view of a first system according to the invention.

Referring now in detail to the drawings for the purpose of illustrating preferred embodiments of the present invention, a system 2 according to the present invention is illustrated in FIG. 1.

FIG. 1 is a schematic view of a system 2 according to the invention. The system 2 includes a first sensor S1 configured to monitor a first device D1 to which the first sensor S1 is attached. The system 2 also includes two further sensors (S2 and S3) which are configured to monitor a second device D2. The system 2 moreover includes two further sensors (S4 and S5) which are configured to monitor a third device D3. The sensors S1, S2, S3, S4, S5 are configured to communicate wirelessly with a router 4.

The system 2 includes meters (M1 and M2) that are configured to communicate with the router 4 that is configured to communicate wirelessly with a cloud service 8. The router 4 is communicating wirelessly with a user interface 10 represented by a smartphone 10. The router 4 is also configured to communicate wirelessly with control unit 6. The control unit 6 may be an actuator capable of regulating the activity of one or more of the devices D1, D2, D3, or a fourth device D4. Regulation of the activity of one or more of the devices D1, D2, D3, D4 may be carried out by changing a flow (e.g., by using a valve), changing the speed (of a pump or a motor), or by shutting down one or more of the devices D1, D2, D3, D4, by way of example.

The sensors S1, S2, S3, S4, S5 may monitor the devices D1, D2, D3 continuously or in selected time periods such as one minute every hour, one second every minute or another frequency and measurement duration.

The cloud service 8 includes a data storage 36 that can be used to store information received from the router 4 or data modified or calculated by the cloud service 8. The cloud service 8 moreover includes a mathematical statistic model 38 that is configured to estimate and/or forecast the activity of one or more of the devices D1, D2, D3 or the flow (e.g., of a fluid, gas, electricity or heat) through the one or more of the devices D1, D2, D3. The mathematical statistic model 38 may be a mathematical statistic model 38 of any suitable type and the mathematical statistic model 38 may conduct inference on combined data from one or more of the sensors S1, S2, S3, S4, S5 and from one or more of the meters M1, M2, M3 to estimate and/or forecast the activity of one or more of the devices D1, D2, D3 or the flow (e.g., of a fluid, gas, electricity or heat) through the one or more of the devices D1, D2, D3.

The cloud service 8 may receive inputs from a number of other systems (not shown) and by this way information may be gathered from several systems of equal or different types. By this way it is possible to provide an updated mathematical statistic model 38 according to flow profiles (e.g., resource flows) of the devices D1, D2, D3.

It is preferred that the meters M1, M2, M3 are meters of high precision, however, the sensors S1, S2, S3, S4, S5 may be cheap sensors. The data from the meters M1, M2, M3 and from the S1, S2, S3, S4, S5 may be used to predict the flow rate(s) of the D1, D2, D3 by using the mathematical statistic model 38.

The sensors S1, S2, S3, S4, S5 may be configured to measure flow (e.g., of a fluid in a pipe), electricity, temperature, lux (if the sensor is a lux meter for measuring illuminances in a room or outside by way of example) for example.

The devices D1, D2, D3 may be various devices having a flow of "resources" such as power, fluid (e.g., a liquid like a coolant, beverage or water, or a gas such as natural gas). Accordingly, the devices D1, D2, D3 may be HVAC devices such as heating devices, ventilating devices and air conditioning devices or refrigerators, lamps, radiators, floor heating or electronic devices in general.

The system 2 is easy to retrofit at existing installations. The sensors S1, S2, S3, S4, S5 may be added to existing installation, e.g., simply by attaching a wireless temperature sensor S1 to a heating surface or an induction sensor S2 to an electrical device D2 by way of example.

The meters M1, M2, M3 may an existing meters M1, M2, M3 in an existing installation. Thus, some of the elements in the system 2 may already exist in the installation, to which the system 2 is to be retrofit.

It is possible to use a repeater in case that the system 2 has to be installed in a large area. One or more repeaters may be configured to receive a signal and retransmits it at a higher level or higher power, or onto the other side of an obstruction, so that the signal can cover longer distances.

Figure 2:
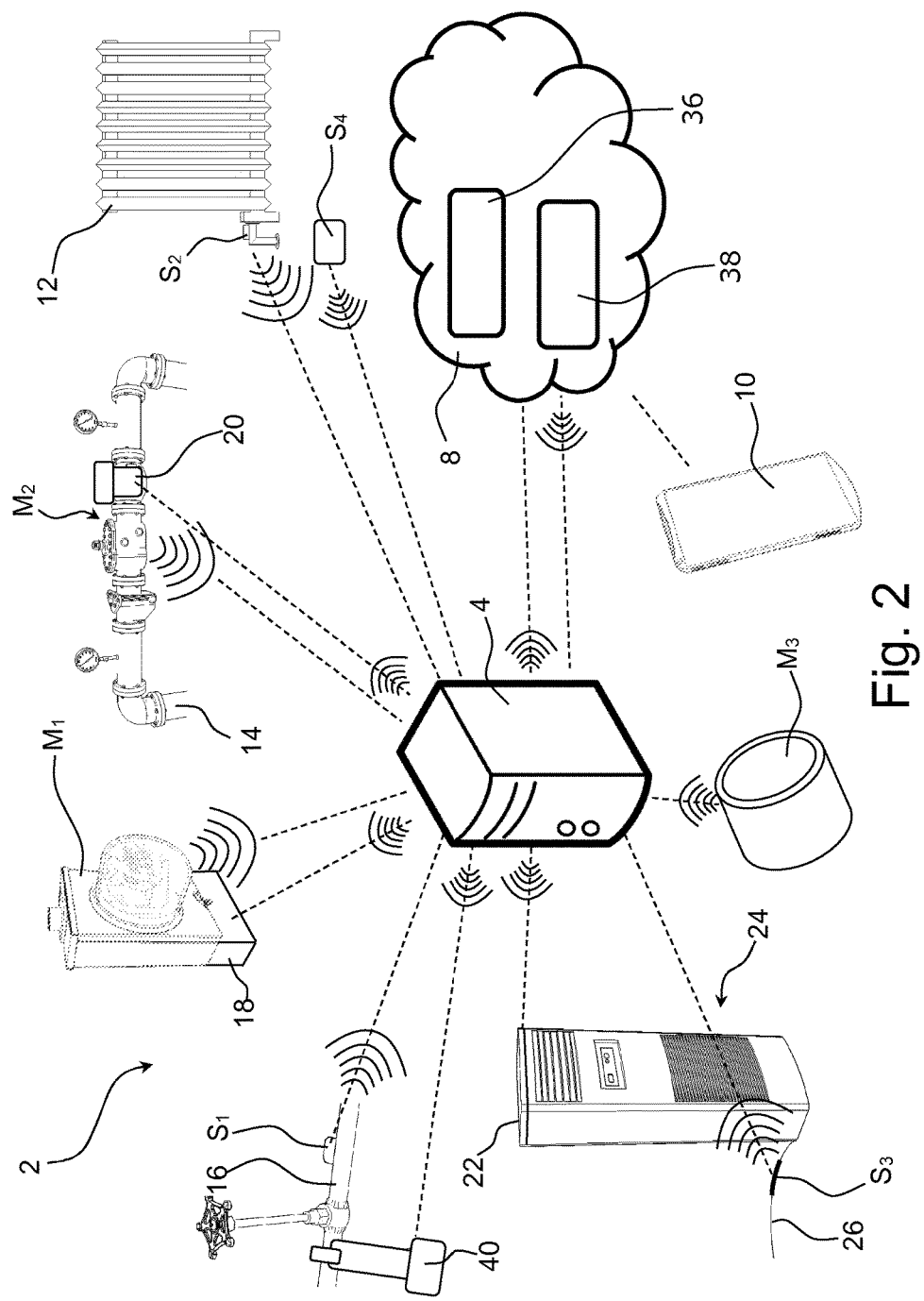
FIG. 2 shows a schematic view of a second system according to the invention.

FIG. 2 illustrates a schematic view of a system 2 according to the invention. The system 2 includes a wireless router 4 that is configured to communicate wirelessly with a group of sensors S1, S2, S3, S4, meters M1, M2, M3, a cloud service 8, a user interface 10 in the form of a smartphone 10, and three control units 20, 22, 40.

The system 2 includes a first meter M1 configured to measure the total power flow of group of electrical devices including an air conditioner 24. It is important to underline that the system may include a large number of electrical devices even though this is not indicated in FIG. 2.

The first meter M1 is configured to communicate wirelessly with the router 4 and send information about the total power flow to the router. The first meter M1 also includes a power switch 18 that can be controlled wirelessly by the router 4. In case that a power alert is generated the router 4 may shout down the main power line by using the power switch 18.

The system 2 further more includes a main pipe (for water supply) 14. The main pipe 14 is equipped with a meter M2 configured to communicate wirelessly with the router 4 and send information to the router 4. The meter M2 is configured to continuously measure the total water flow through the building into which the system 2 is installed.

A valve 20 is mounted on the main pipe 14 and the valve is configured to communicate wirelessly with the router 4. The router 4 can control the valve 20 and hereby regulate the flow through the main pipe 14. The valve 20 can reduce (e.g., by closing the valve 20) the flow through the main pipe 14, increase the flow through the main pipe 14, or maintain a constant the flow through the main pipe 14.

The system 2 also includes a third meter M3 that is configured to communicate wirelessly with the router 4. The router 4 receives wireless information about the total energy flow measured by the energy meter M3.

The first sensor S1 is attached to a first device 16 that is a water pipe 16. The water pipe 16 is provided with a control unit formed as a valve 40. The first sensor S1 is configured to detect the flow through the pipe 16 or if there is flow through the pipe 16 or if the flow through the pipe 16 is changing and then to send the detected information wirelessly to the router 4. The router 4 is configured to send wireless signals to the valve 40 and hereby control the valve 40, e.g., in order to regulate the flow through the pipe 16. The valve 40 may be closed in order to stop the flow through the pipe 16 in case of leakage (detected by the router 4). The router may compare the flow measured by the first sensor S1 with the total flow measured by the meter M2 at the main pipe 14.

It may be an advantage that the sensor S1 only is required to detect if there is flow through the pipe 16 or if there is change in the flow through the pipe 16. Hereby a simple a cheap sensor S1 may be applied to the system 2.

The second sensor S2 is attached to a heater 12. The second sensor S2 is configured to detect the temperature of the heater 12 and/or flow of water through the heater 12 or to detect if there is flow through the heater 12 and send the detected information wirelessly to the router 4. It may be an advantage that the sensor S2 only is required to detect if there is flow through the heater 12 or if there is change in the flow through the heater 12 since it then would be possible to apply a simple, cheap sensor S2 in the system 2.

The third sensor S3 is attached to the power cable 26 of an air conditioner 24. The third sensor S3 is configured to detect the temperature of the heater 12 and/or flow of water through the heater 12 and send the detected information wirelessly to the router 4. It may be an advantage that the sensor S3 only is required to detect if there is power at the cable 26. In this way it would be possible to use a simple a cheap sensor S3 in the system 2.

The air conditioner 24 includes a control unit 22 provided on the top of the air conditioner 24. The control unit 22 is capable of regulating the activity of the air conditioner 24. The control unit 22 is controlled wirelessly by the router 4. This means that the router 4 can switch off turn on, and regulate the activity of the air conditioner 24 by communicating wirelessly with the control unit 22.

The system 2 also includes a sensor S4 that not is attached to any particular device. The sensor S4 may be a temperature sensor place in any suitable location, e.g., in order to detect the room temperature, by way of example. The sensor S4 may also be a lux sensor configured to measure the inflow of light, since this information may be important when deciding whether to turn on the heater 12 or not.

The system 2 includes a cloud service 8 including a data storage 36 that can be used to store information received from the router 4 or data modified or calculated by the cloud service 8. The cloud service 8 also includes a mathematical statistic model 38 that is configured to estimate and/or forecast the activity (flow of water, power, or heat energy) of one or more of the devices 16, 24, 12 of the system. Any suitable mathematical statistic model 38 may be applied and the mathematical statistic model 38 may conduct inference on combined data from one or more of the sensors S1, S2, S3, S4 and from one or more of the meters M1, M2, M3 to estimate and/or forecast the activity of one or more of the devices 16, 24, 12.

The user interface 10 that is a smartphone 10 communicates wirelessly with the router 4. Hereby the user of the system 2 can have access to information about the estimated or predicted resource flow of at least a selection of the devices 16, 12, 24. The smartphone 10 may also be used to control the control units 22, 40, 20 through the router 4 or to change settings in the router 4 (e.g., upload new structures or parameters to the mathematical statistic model 38).

The system 2 may be used to generate an alert and shut down or regulate the activity of the any of the devices 16, 24, 12, e.g., in order to reduce the total energy flow. By way of example, the system 2 will automatically detect if the heater 12 and the air conditioner 24 are activated at the same time. The system 2 will then either switch off the heater 12 (in case the room temperature is within a predefined comfort zone). It the room temperature is higher than the preferred room temperature, the system 2 may increase the activity of the air conditioner 24. K on the other hand, the room temperature is lower than the preferred room temperature, the system may switch off the air conditioner 24 and turn on the heater 12.

Figure 3:
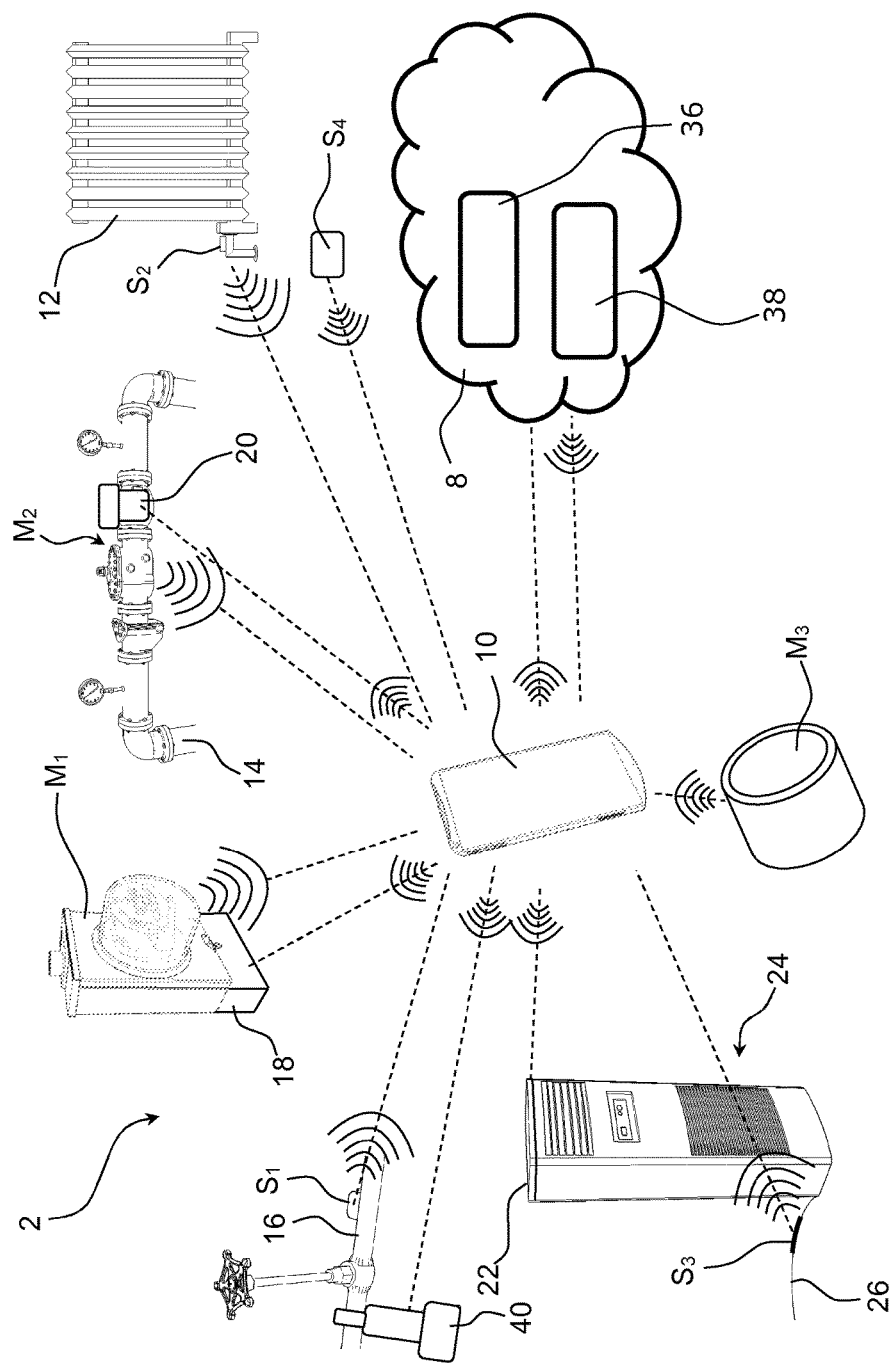
FIG. 3 shows a schematic view of a third system according to the invention.

FIG. 3 illustrates a schematic view of a system 2 that is almost similar to the system 2 illustrated in FIG. 2. The wireless router 4 is, however, replaced with a user interface 10 in the form of a smartphone 10. The smartphone 10 is configured to communicate wirelessly with a group of sensors S1, S2, S3, S4, meters M1, M2, M3, a cloud service 8, and three control units 20, 22, 40. The function of the system 2 corresponds to the function of the system 2 illustrated in FIG. 2. It is important to point out that the user interface 10 may be any other type of suitable user interface, e.g., a laptop.

Figure 4:
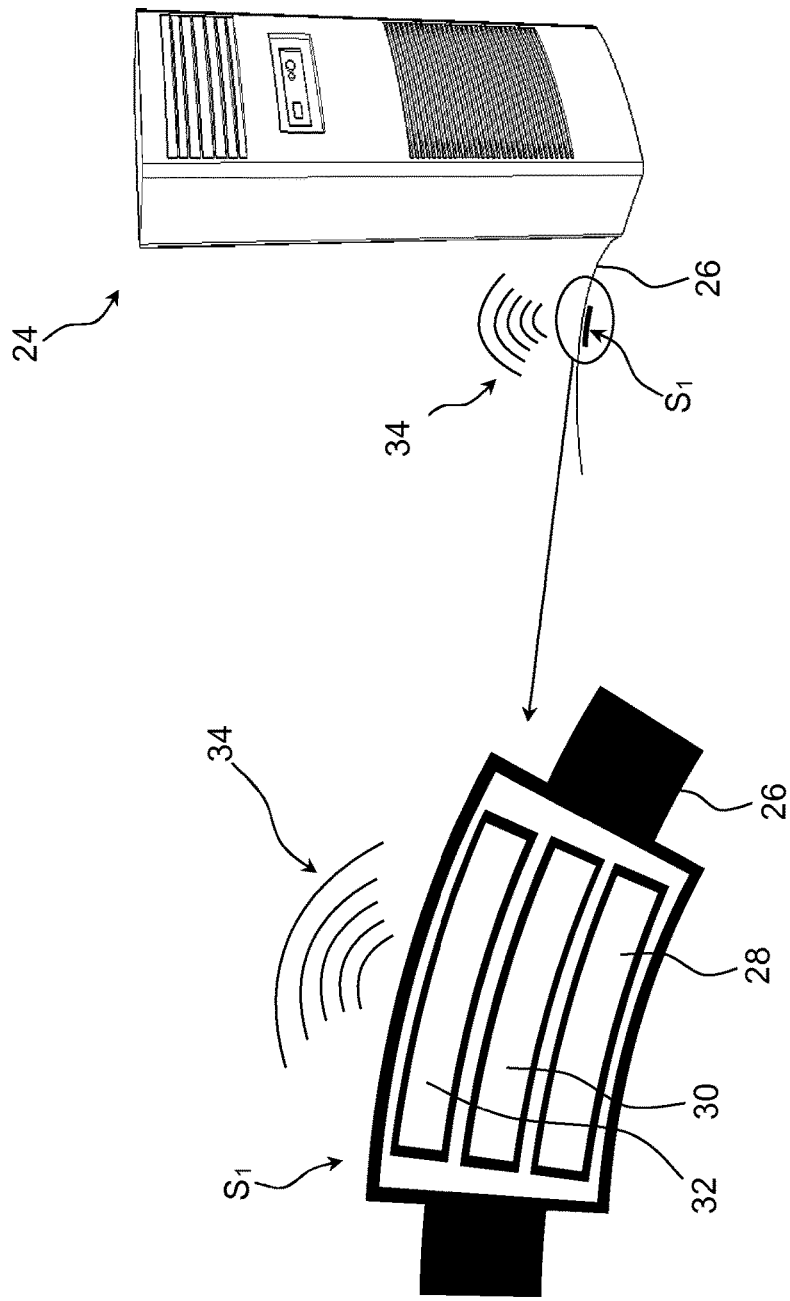
FIG. 4 shows a device being monitored by a system according to the invention.

FIG. 4 illustrates a schematic view of the air conditioner 24 illustrated in FIG. 2 and in FIG. 3. FIG. 4a) is a schematic close-up cross sectional view of a sensor S1 attached the power cable 26 of the air conditioner 24. FIG. 4b) is a perspective view of the air conditioner 24.

In FIG. 4b) it can be seen that the air conditioner 24 has a power cable 26 to which a sensor S1 is attached. The sensor S1 is configured to send a wireless signal 34 to a router or a user interface (not shown).

In FIG. 4a) it can be seen that the sensor S1 includes an energy harvester 28, arranged next to a centrally arranged power manager 30 that is arranged next to a wireless transducer 32. The energy harvester 28 may be any suitable type of energy harvester. The power manager 30 may be any unit capable of generating a signal 34 that can be send by using the wireless transducer 32.

It may be an advantage that the harvested energy is used to detect activity of the air conditioner 24. It would then be possible to provide a sensor S1 capable of generating a wireless signal 32 when energy is harvested. When the air conditioner 24 is activated the power cable 26 will be current-carrying and thus energy will be harvested.

The sensor S1 may, however, be provided with a battery and or a number of capacitors or any other suitable energy storage if necessary.

The system 2 according to principles of the present invention may be used to detect early warning of emerging problems (e.g., leakage of water in a pipe network or emerging disease in an animal herd).

The system 2 may also be used to detect overconsumption of resources, e.g., if a heater 12 and an air conditioner are activated at the same time. In this case the system 2 may be configured to take care of the situation and switch off or regulate the activity of at least one of the devices.

The system 2 may be used to provide general information about the actual flows of resources over time and to generate alarms in case of sudden failures. Besides the system may be used to estimate or predict future resource flow of the devices.

The system 2 may also be used to simulate the future resource flow of a new constellation of devices (e.g., if a company considers to increase the number of devices due to an increased production capacity demand).

The system 2 may be used to benchmarking similar devices, to perform service surveillance on technical devises, and to allow for remote surveillance.

The sensors S1, S2, S3, S4 and the meters M1, M2, M3 may each contain a unique identifier (e.g., number, signature, description, or ID). In this way the router 4 or the user interface 10 is capable of coupling each incoming wireless signal 34 with a specific device. In other words, the use of a unique identifier secures that the wireless signal 34 can be used in an optimum way by the route 4 or the user interface 10.

The sensors S1, S2, S3, S4 may be configured to detect when the devices D1, D2, D3, 12, 16, 24 are activated (when the devices are switched on or when there is a flow of a resource, e.g., water, gas, or current, through the device).

Figure 5:
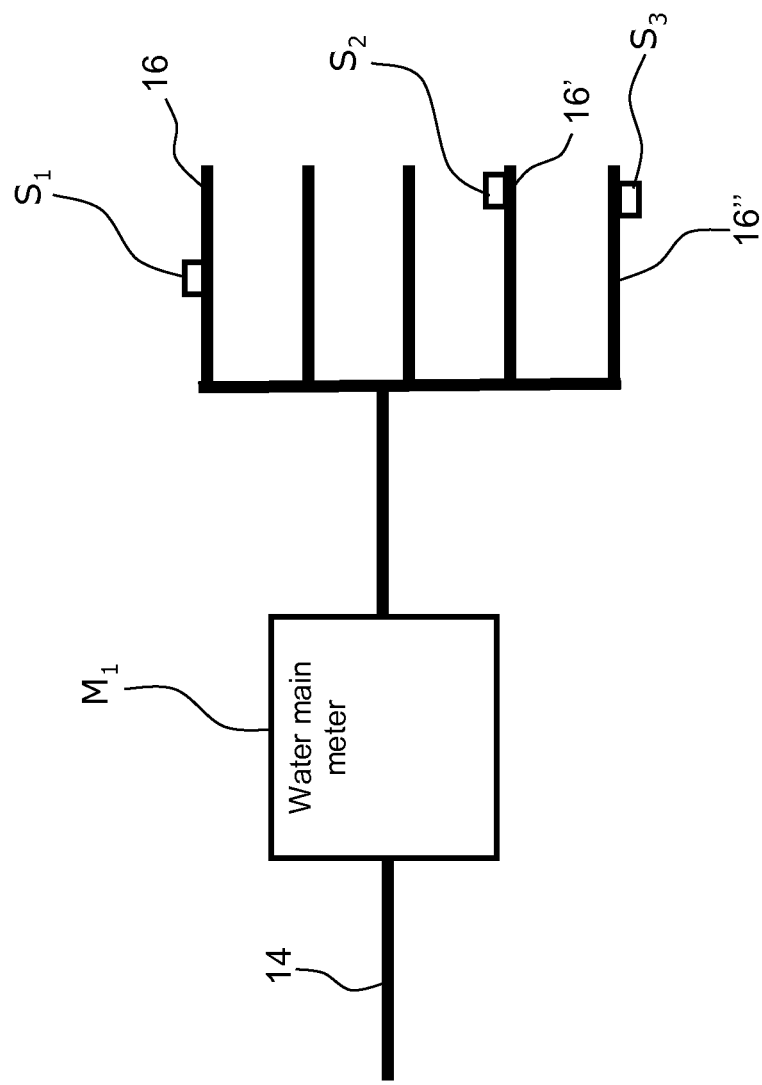
FIG. 5 shows a portion of a system according to the invention.

FIG. 5 illustrates a portion of a system 2 according to principles of the present invention. FIG. 5 illustrates how a system 2 can be used to measure water flow in a main pipe 14 and in a number of smaller distribution pipes 16.

The water supplied to the installation is metered by one main meter M1 that provides measurements of high precision (e.g., approved by authorities or within standards for flow measurements). The main pipe 14 is in fluid communication with a plurality of smaller distribution pipes 16, while a number of sensors S1, S2 and S3 are attached to the outside of some of these smaller distribution pipes 16, 16', 16".

In the following, we take a look at the metering at sensor S1. The sensor S1 is a piezoelectric sensor that includes simple piezo elements. Thus, the sensor signal changes with the flow in the pipe 16. The signal from the sensor S1 depends, however, on the material and the dimension of the pipe 16, the sensor attachment, and the medium (in this example water). Accordingly, and the sensor signal must be "transformed" or "adjusted/calibrated" to give the actual flow (the flow that would be achieved by using a high precision meter). In a prior art system it would be necessary to apply "a high quality sensor" configured to measure flow in the specific environment (the dimensions of the pipe 16, the material of the pipe 16, and attachment type).

Since the present invention applies a mathematical statistic model it is possible to use a simple sensor S1 to determine the flow at the pipe 16. The use of a mathematical statistic model makes it possible to compensate for the low precision of the sensor S1.

The sensor S1 is attached to the outside of the pipe 16 and hereafter it is possible to sample a series of measurements from the sensor S1, over a timespan.

In the same timespan a series of measurements is sampled from the main meter M1 in the same timespan.

The mathematical statistic model is used to estimate the part of the main meter flow that flows through the pipe 16 having the sensor S1 attached to it. It is possible to carry out a time-dependent transformation of the measurements of sensor S1 in order to correct for the actual environment of the sensor S1.

A less computer-demanding approach can be obtained by using a mathematical statistic model to estimate if a time-independent transformation can be used.

It may be an advantage to use the time-independent transformation, rather than the full mathematical statistic model, on the running measurements from the sensor S1.

It may be beneficial from time to time, to test if the precision of the transformation is acceptable, and update it if needed, using the mathematical statistic model.

The necessary amount of samples needed can be obtained by estimating the measurement error of the transformation. In this manner, the results can be detained until the desired precision is obtained.

In the following, one preferred method to estimate the latent stochastic process using a mathematical statistic model 38 is described. The latent stochastic process can be modelled by, e.g., a state space model defined by $$Y_t = F_t \theta_t + \varepsilon_t \quad \varepsilon_t \sim N(0, V_t) \tag{1}$$

$$\theta_t = G_t \theta_{t-1} + \vartheta_t \quad \vartheta_t \sim N(0, W_t) \tag{2}$$

where $Y_t$ is a vector determines (e.g., describing, or defining) the observed process at time t, includes observed data from the sensor $(S_1, S_2, \ldots, S_n)$ and/or the meters $M_1, M_2, \ldots, M_k$; $\theta_t$ is a vector determine the latent stochastic process at time t, including latent process data, such as percent ventilation efficiency, percent overconsumption of resources, resource flow, device health status, etc; $F_t$ is the regression matrix which determine the linear relation between the latent process and the observed process at time t; $G_t$ is the evolve matrix which determine the linear transition from time t−1 to time t in the latent process; $\varepsilon_t$ and $\vartheta_t$ are zero mean multivariate Gaussian distributed noise vectors of the observed process and the latent process respectively; $V_t$ is the observation variance-covariance matrix; and $W_t$ is the evolution variance-covariance matrix.

The model parameter matrices $F_t$ and $G_t$ may be estimated by, e.g., the Kalman filter, using prior data from the modelled system and/or similar systems, hereunder the said data provided by the user and/or experts in the field. Standard statistical methods can be used to conduct inference (e.g., estimate information) on the process. The information can be, e.g., an estimated signal (e.g., trend) and/or forecasts (e.g., prognosis) of the process, and the related distributions of the estimates, variance and/or confidence intervals. Using these kinds of estimates, it is easy to, e.g., raise warnings and/or alarms. For example an alarm can be chosen to appear if the probability of an observed deviation in the process is less than 0.1% probable to occur by change.

The above model framework is a special case of the more general model framework $$Y_t = f_t(\theta_t) + \varepsilon_t \quad \varepsilon_t \sim \delta_1(V_t) \tag{3}$$

$$\theta_t = g_t(\theta_{t-1}) + \vartheta_t \quad \vartheta_t \sim \delta_2(W_t) \tag{4}$$

where $f_t$ and $g_t$ are general functions, $\delta_1$ and $\delta_2$ are general statistical distributions, and all other terms are as described above.

Inference on this more general model framework can be conducted by, e.g., the extended Kalman filter in cases where the relation between the latent process and the observed process is non-linear, and the Kalman-Bucy filter in cases where the time is defined (e.g., described) on a continuous scale.

Other time series analysis method and/or multivariate data-analysis methods, such as Analysis of Variance (ANOVA), Markov models, Generalized Linear Models (GLM), and Multivariate Gaussian Models may as well be used to estimate the said latent stochastic process, and infer the said information.

LIST OF REFERENCE NUMERALS

2 System
4 Router
6 Control unit
8 Cloud service
10 User interface
$D_1, D_2, D_3$ Device
$S_1, S_2, S_3, S_4, \ldots, S_n$ Sensor
$M_1, M_2, M_3$ Meter
12 Heater
14 Main pipe
16, 16', 16" Pipe
18 Power switch
20 Valve
22 Control unit
24 Air conditioner
26 Cable
28 Energy harvester
30 Power manager
32 Wireless transducer
34 Wireless signal
36 Data storage
38 Mathematical statistical model
40 Valve While the invention has been described in detail with reference to exemplary embodiments thereof, it will be apparent to one skilled in the art that various changes can be made, and equivalents employed, without departing from the scope of the invention. The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

I claim:

1. A system useful for monitoring resource flows at a number of devices characterized by a latent stochastic process, the system comprising:
    at least one sensor selected from the group consisting of piezoelectric sensors, induction sensors, temperature sensors, and lux sensors, configured to detect a flow rate and/or a change in a flow rate at said devices, wherein said at least one sensor is attached non-intrusively to said devices, and wherein said at least one sensor is configured to wirelessly communicate data;
    a receiving unit configured to wirelessly receive said data from said at least one sensor;
    at least one meter configured to measure an overall flow for at least a part of the devices; and
    a calculation module configured to receive information from the at least one sensor and the at least one meter, wherein the calculation module is in communication said at least one sensor;
    wherein said calculation module comprises a mathematical statistical model, wherein the mathematical statistical model is configured to estimate and/or predict flow of resources and/or performance of at least a selection of the devices based on data from the at least one sensor and from the at least one meter;
    wherein the calculation module is further configured to calibrate said at least one sensor based on said mathematical statistical model operating on said information from said at least one sensor and said at least one meter;
    wherein the data from the at least one sensor and from the at least one meter at time t are given as a vector $(Y_t)$, wherein the latent stochastic process at time t is a vector $(\theta_t)$, wherein the mathematical statistic model uses a noise vector $(\varepsilon_t)$ of the data from the at least one sensor and from the at least one meter at time t and a noise vector $(\vartheta_t)$ of the latent stochastic process at time t, and wherein a statistical distribution of the noise vectors $(\varepsilon_t, \vartheta_t)$ is estimated based on the data from the at least one sensor and from the at least one meter.

2. A system according to claim 1, further comprising: a user interface configured and arranged to provide access to the estimated and/or predicted resource flows of at least a selection of the devices.

3. A system according to claim 1, further comprising: at least one router;
    wherein the at least one router comprises the calculation module.

4. A system according to claim 1, wherein at least one of the at least one sensor comprises an energy harvester.

5. A system according to claim 4, wherein:
    the at least one sensor is configured to use energy harvested by the energy harvester to detect resource flow; or
    the system is configured to use energy harvested by the energy harvester to change resource flow rate of at least one of the devices.

6. A system according to claim 1, wherein the calculation module and the mathematical statistic model are integrated in an apparatus of the system.

7. A system according to claim 1, wherein the calculation module is a cloud service comprising a mathematical statistic model and a data storage.

8. A system according to claim 1, further comprising:
    a control unit configured to change the activity of one or more of the devices.

9. A system according to claim 1, wherein the calculation module is configured to estimate the actual and/or future activity of at least a selection of the devices.

10. A system according to claim 2, wherein the user interface is a remote user interface.

11. A system according to claim 1, wherein:
    vector $Y_t$ is given by $Y_t = f_t(\theta_t) + \varepsilon_t;$ vector $\theta_t$ is modelled by an underlying process $\theta_t = g_t(\theta_{t-1}) + \vartheta_t;$ and $f_t$ and $g_t$ are mathematical functions.

12. A system according to claim 1, wherein the at least one meter is configured to measure a total power flow for a group of electrical devices, or to measure a total water flow, or to measure energy consumption.

13. A method for monitoring resource flows at a number of devices with a receiving unit which wirelessly receives data from a number of sensors selected from the group consisting of piezoelectric sensors, induction sensors, temperature sensors, and lux sensors, wherein said number of sensors are attached non-intrusively to said devices, wherein said number of sensors are configured to wirelessly communicate data to said receiving unit, wherein said number of sensors are configured to detect the flow rate and/or the change in the flow rate at device level, and a number of meters configured to measure the flow for at least a part of the devices characterized by a latent stochastic process, the method comprising:
    estimating and/or predicting loss and/or flow of resources of at least a selection of the devices by using a calculation module configured to receive information from the sensors and the meters, wherein the calculation module is in communication with and configured to calibrate said number of sensors by applying a mathematical statistical model, whereby the mathematical statistical model is configured to estimate and/or predict flow of resources and/or performance of at least a selection of said number of devices based on data from said sensors and said meters;
    wherein data from said sensors and from said meters at time t are given as a vector $(Y_t)$, wherein the latent stochastic process at time t is a vector $(\theta_t)$, wherein the mathematical statistic model uses a noise vector $(\varepsilon_t)$ of data from the sensors and from the meters at time t and a noise vector $(\vartheta_t)$ of the latent stochastic process at time t, and wherein a statistical distribution of the noise vectors $(\varepsilon_t, \vartheta_t)$ is estimated on the basis of the data from the sensors and from the meters; and
    calibrating said sensors based on said mathematical statistical model operating on said data from the sensors and from the meters in said calculation module.

14. A method according to claim 13, wherein the resource flows at the number of devices is characterized by a latent stochastic process, and wherein said estimating and/or predicting is performed with a system comprising:
- at least one sensor configured to detect a flow rate and/or a change in a flow rate at said devices;
- a receiving unit configured to receive data from said at least one sensor;
- at least one meter configured to measure an overall flow for at least a part of the devices; and
- a calculation module configured to receive information from the at least one sensor and the at least one meter, wherein the calculation module comprises a mathematical statistical model configured to estimate and/or predict flow of resources and/or performance of at least a selection of the devices;
- wherein the data from the at least one sensor and from the at least one meter at time t are given as a vector ($Y_t$), wherein the latent stochastic process at time t is a vector ($\theta_t$), wherein the mathematical statistic model uses a noise vector ($\varepsilon_t$) of the data from the at least one sensor and from the at least one meter at time t and a noise vector ($\vartheta_t$) of the latent stochastic process at time t, and wherein a statistical distribution of the noise vectors ($\varepsilon_t$, $\vartheta_t$) is estimated based on the data from the at least one sensor and from the at least one meter.

15. A method according to claim 13, further comprising:
- controlling the activity of one or more of the devices based on said estimating and/or predicting.

16. A method according to claim 14, wherein:
vector $Y_t$ is given by $$Y_t = f_t(\theta_t) + \varepsilon_t;$$

vector $\theta_t$ is modelled by an underlying process $$\theta_t = g_t(\theta_{t-1}) + \vartheta_t; \text{ and}$$

$f_t$ and $g_t$ are mathematical functions.

* * * * *